(12) United States Patent
Radosevich et al.

(10) Patent No.: US 7,358,442 B2
(45) Date of Patent: Apr. 15, 2008

(54) BUS STRUCTURE FOR POWER SWITCHING CIRCUITS

(75) Inventors: Lawrence D. Radosevich, Muskego, WI (US); Steven C. Kaishian, Milwaukee, WI (US); Daniel G. Kannenberg, Waukesha, WI (US); Timothy A. Roebke, Milwaukee, WI (US); Andreas A. Meyer, Richmond Heights, OH (US); Dennis L. Kehl, Benton Harbor, MI (US); Lee A. Gettelfinger, Brown Deer, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 609 days.

(21) Appl. No.: 10/675,189

(22) Filed: Sep. 30, 2003

(65) Prior Publication Data

US 2005/0068820 A1 Mar. 31, 2005

(51) Int. Cl.
*H02B 1/26* (2006.01)
(52) U.S. Cl. ...................... 174/68.2; 361/637
(58) Field of Classification Search ............... 174/68.2; 439/76.2, 180, 213, 36, 720; 361/144, 355, 361/637
See application file for complete search history.

(56) References Cited

U.S. PATENT DOCUMENTS 6,008,982 A * 12/1999 Smith .......................... 361/624

* cited by examiner

*Primary Examiner*—Jinhee J. Lee
(74) *Attorney, Agent, or Firm*—Patrick S. Yoder; Alexander R. Kuszewski

(57) ABSTRACT

A bus system is disclosed for use with switching devices, such as power electronic devices. The system includes generally parallel bus elements that define electrical reference planes, such as for a dc bus. The bus elements are separated from one another by insulative layers, with additional insulative layers being available for separating the system from other circuit components. Portions of the bus elements are extended or exposed to permit connection to the circuit elements, including packaged switching circuits and energy storage or filtering circuits. The bus system may be conformed to a variety of geometric configurations, and substantially reduces parasitic inductance and total loop inductance in the resulting circuitry.

13 Claims, 7 Drawing Sheets

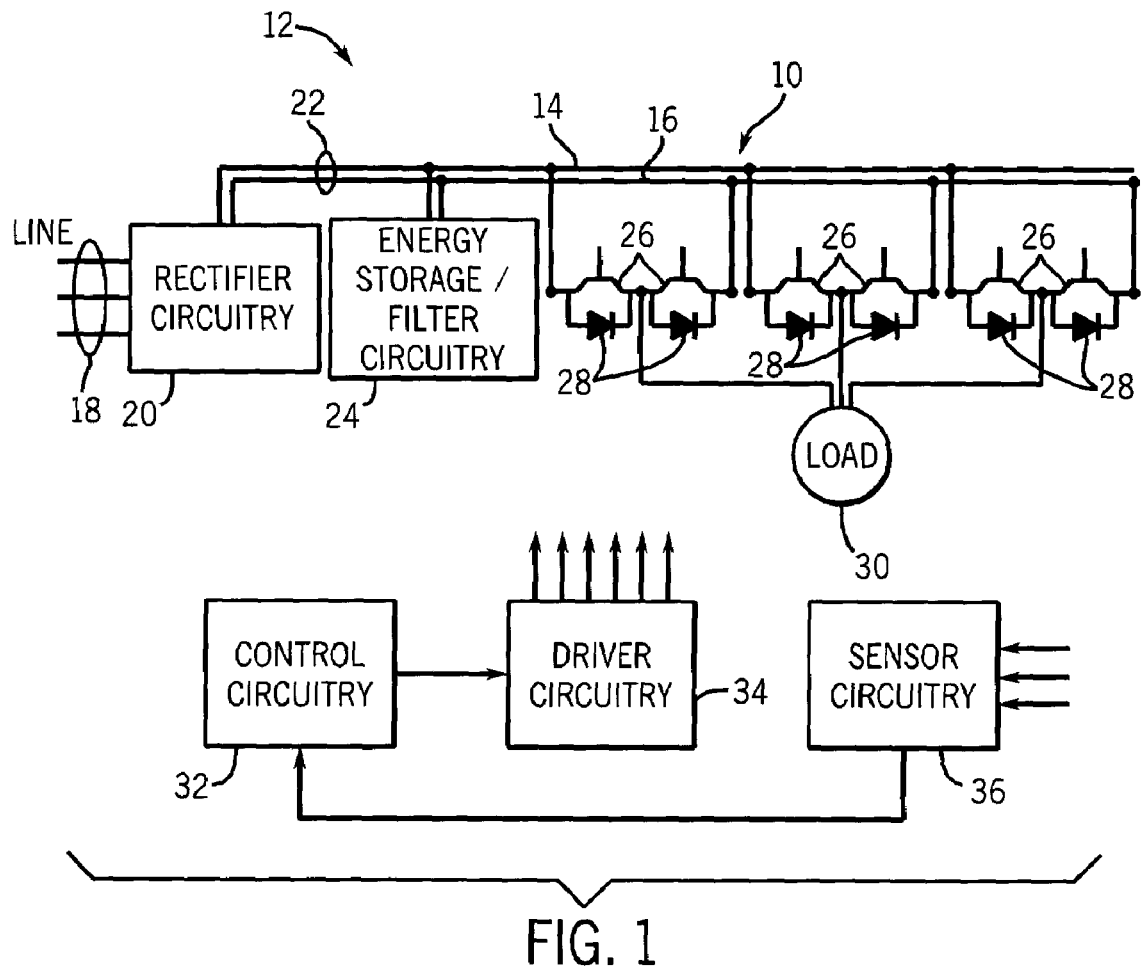
FIG. 1
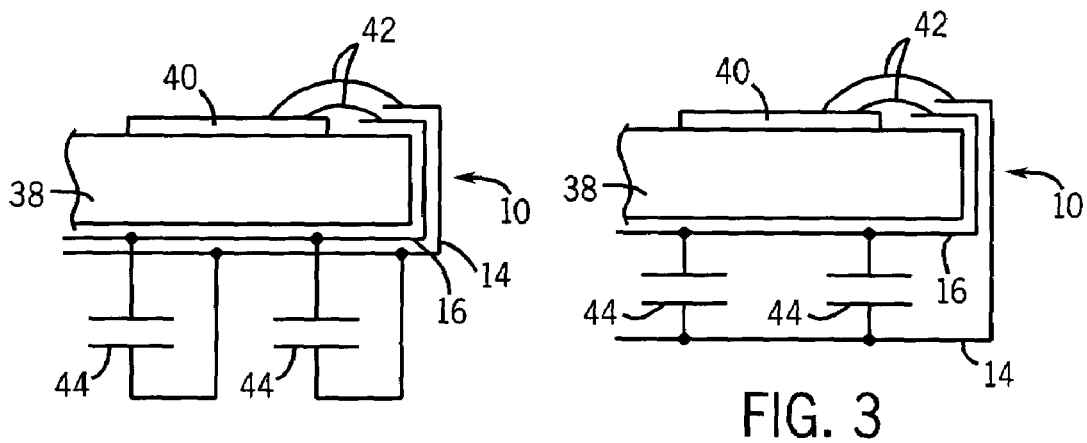
FIG. 2
FIG. 3

BUS STRUCTURE FOR POWER SWITCHING CIRCUITS

BACKGROUND OF THE INVENTION

The present application relates generally to the field of power electronics and power switching devices. More particularly, the invention relates to a novel bus structure for use in such devices to reduce parasitic inductance.

Many applications exist for power electronic devices, including solid state switches. Such applications are found throughout the industry, and increasingly in non-industrial settings as well. In general, solid state switches may be used in a variety of circuitry, such as in inverter circuits that simulate desired waveforms, such as ac waveforms. In industrial drive applications, for example, power may be received from the power grid, converted to dc power, and then reconverted to controlled-frequency ac power by a switched inverter circuit. Devices of this type are used in conventional variable frequency drives, as well as in a variety of other products. Other applications include power converters, generators, power conditioning circuits, and so forth.

In conventional circuits based upon solid state power switches, the switches may be controlled to switch between conductive and non-conductive states extremely rapidly. Voltage spikes tend to occur, however, during turn-on stages of operation which can be detrimental to the operation of the circuitry. That is, as the solid state switching device is switched from a non-conducting state to a conducting state, such as to provide power to an output terminal, depending upon the configuration of the circuitry, large voltage spikes may occur which can cause damage to the switch and to other circuitry. In many cases, voltage spikes are caused by parasitic inductance in a dc circuit path, such as defined between elements of a dc bus used to convey power from a rectifier circuit to an inverter circuit. Similar problems exist both in single-phase circuitry and in three-phase circuitry.

While attempts have been made to improve performance of solid state switching circuits, additional improvement is necessary. For example, attempts have been made to place bus structures close to solid state switches to reduce the overall inductance of the bus. However, such attempts have not been entirely successful, and may involve complex mechanical designs with limited actual impact upon reducing the voltage spikes in operation.

SUMMARY OF THE INVENTION

The present invention provides a novel bus design, and packaged circuitry incorporating such designs which respond to such needs. In accordance with aspects of the technique, a bus structure is defined by conductive planes which are placed generally parallel to one another and separate from one another and from neighboring conductors by insulative layers. The bus structure may be formed to accommodate both-single phase and multiple-phase circuitry. The technique facilitates unique packaging configurations, such as between switching devices and energy storage devices, such as capacitors, that are positioned variously in an overall package configuration, such as on different sides of a support. The bus structure, which may be considered generally as a laminated bus, affords substantial reduction in parasitic conductance of the circuitry, while facilitating a variety of demanding packaging concerns, including bending of the bus around circuit elements and mechanical supports. The bus elements are designed to be disposed for direct connection to a conductor from power electronic switches.

BRIEF DESCRIPTION OF THE DRAWINGS

The foregoing and other advantages and features of the invention will become apparent upon reading the following detailed description and upon reference to the drawings in which:

FIG. 1 is a circuit diagram illustrating, diagrammatically, an exemplary laminated bus structure in accordance with aspects of the present technique for a solid state switching circuit;

FIG. 2 is a diagrammatical representation of an implementation of the bus structure of FIG. 1 in a power electronics package;

FIG. 3 is a diagrammatical representation similar to FIG. 2 showing an alternative arrangement for energy storage components in the package;

DETAILED DESCRIPTION OF SPECIFIC EMBODIMENTS

Figure 4:
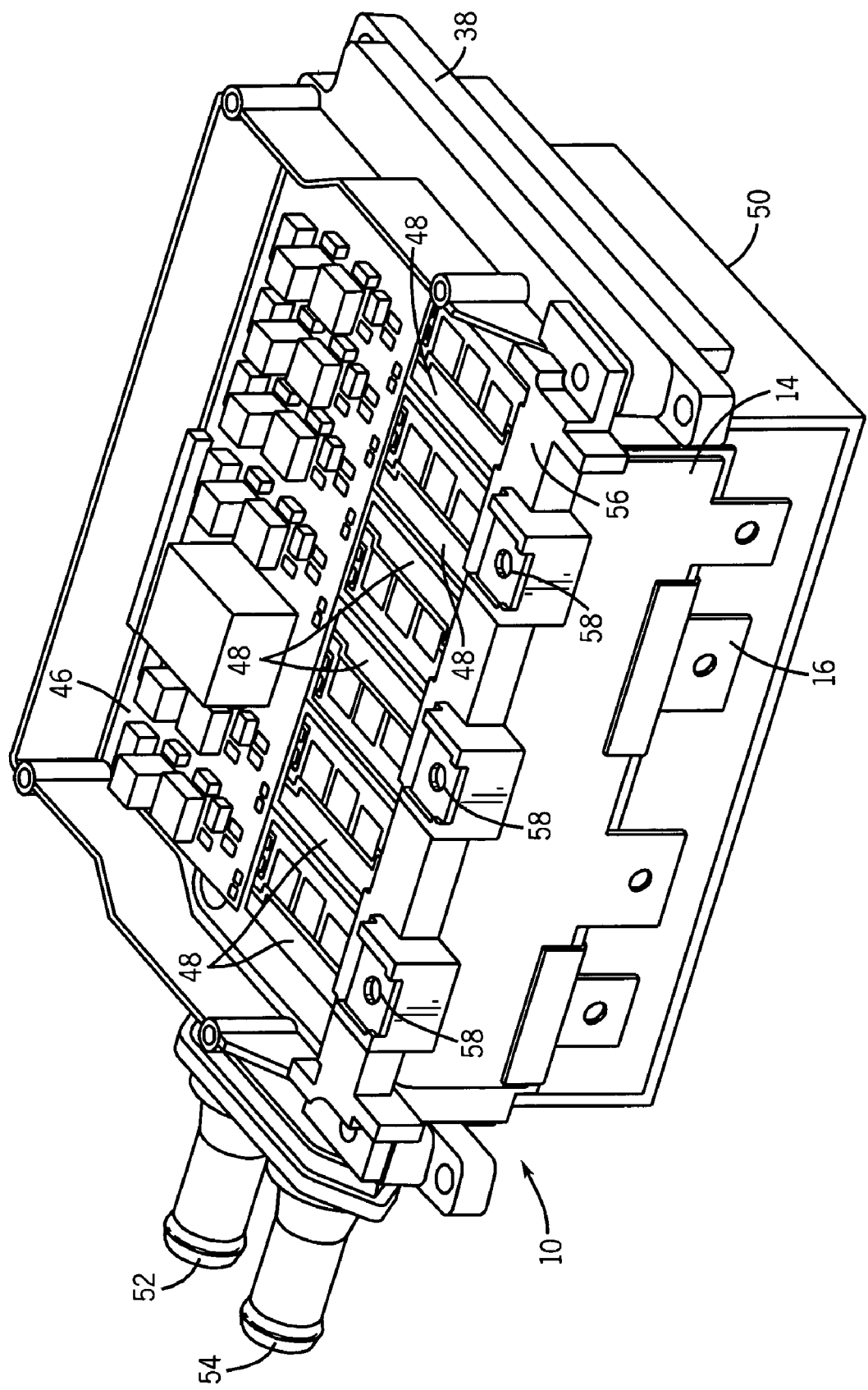
FIG. 4 is a perspective view of a portion of an exemplary implementation of the bus structure of the present technique as applied to a module power converter.

Turning now to the drawings, and referring first to FIG. 1, a bus system 10 in accordance with the present technique is illustrated diagrammatically as applied to a power converter circuit 12. The bus system includes a pair of bus elements 14 and 16 which extend generally parallel to one another in generally core extensive planes. It should be noted that, as described herein, the bus system is, in exemplary embodiments, comprised of two generally parallel elements. However, additional elements, linked to one another or separate from one another may be provided in the alternative configurations. Similarly, while the elements are generally co-extensive with one another, some degree of non-overlap may occur in the elements, as described more fully below in an exemplary embodiment. Moreover, while the elements are described as extending generally in planes, it should be understood that the elements are planar in so much as they are generally flat. A distinct advantage of the present technique, in fact, resides in the ability to configure the bus system with flat flexible conductive and insulative elements such that the bus system itself can be bent or curved out of a single geometric plane.

In the illustration of FIG. 1, the bus system is applied to a converter circuit that serves to convert three-phase line power to control frequency ac power for use in powering various loads. As will be appreciated by those skilled in the art, the configuration of FIG. 1 may generally correspond to an inverter drive, such as a three-phase motor drive. More generally, however, the present technique is applicable in a wide range of settings, including converter circuits of the type illustrated in FIG. 1, converter-converter circuits, generator circuits, power conditioning circuits, and any other power electronic circuit in which parasitic inductance is to be reduced in a dc bus coupled to switching devices.

In the illustration of FIG. 1, the converter circuit example takes power from a line or power grid as represented generally at reference numeral 18, and applies the power to a rectifier circuitry 20. The rectifier circuitry 20 may, in addition to rectifying the three-phases of power, perform additional functions such as filtering, voltage regulation, and so forth. The rectifier circuitry 20 applies dc power to a dc bus as represented at reference numeral 22 in FIG. 1. Various circuitry may be provided across the dc bus, particularly for performing various power signal filtering and energy storage functions. In the embodiment illustrated in FIG. 1, for example, energy storage circuitry 24 is coupled across the dc bus 22, and may include a series of capacitors for storing power and for smoothing power variations over the bus during operation. In the embodiment illustrated in FIG. 1, a three-phase inverter circuit is provided across the dc bus, and includes a series of solid state switching devices 26, each paired with a flyback diode 28. Switching devices 26 may include any suitable type of switch, such as IGBTs, MOSFETs, and so forth. As will be appreciated by those skilled in the art, by controlling switching of the switching devices 26, current is caused to flow from the dc bus to a load 30. Appropriate switching of the devices, then, may result in desired waveforms being applied to load 30, such as simulated three-phase ac forms of desired frequencies. In certain applications, the switches may be controlled so as to provide a single output frequency, such as for driving conventional loads at 60 Hz or 50 Hz.

It should be noted that, in certain presently contemplated arrangements, circuits other than rectifier circuits may be used in conjunction with inverter circuitry of the type shown in FIG. 1. For example, in certain vehicle drives, the rectifying circuitry illustrated in FIG. 1 may, in fact, resemble the inverter circuitry shown. In a first power flow direction, then, the circuitry would serve essentially as a rectifier for providing dc power to the dc bus. In an opposite power flow direction, however, the circuitry allow for switching, in a manner similar to that of switching devices 26, to clean and condition signals, such as in a regeneration mode. In such cases, the bus system described herein may also extend to terminal locations for the switches of such circuitry.

In the embodiment illustrated in FIG. 1, the switches 26 are controlled by control circuitry 32 linked to driver circuitry 34. The control circuitry 32 may implement various control algorithms, such as for starting sequences, shutdown sequences, steady-state operation, or any other suitable control scheme. The driver circuitry 34 receives control signals from the control circuitry 32 and applies appropriate signals to the switching devices 26 to regulate their operation. In general, the driver circuitry 34 will cause the switches 26 to switch between conductive and non-conductive states for generating the desire to output waveforms. Sensor circuitry 36 may be provided for receiving various sensor inputs, which may include electrical, mechanical, thermal, and any other suitable inputs for regulating the operation of the overall circuitry. Conventional sensor circuitry may, for example, include feedback of voltages, currents, speeds, indications of undesirable conditions, and so forth.

The bus system 10 illustrated in FIG. 1, preferably provides parallel conductive electrical reference planes which extend generally along one another for canceling parasitic inductance. In a presently preferred embodiment, the bus elements 14 and 16 define a continuous reference planes extending between terminations of the energy storage circuitry and terminations of the solid state switches. That is, the bus elements may be directly connected or coupled to a conductor extending from the switches, rather than to any indirect interconnect, as in heretofore known devices. In other contexts, such as where filtering circuitry is provided in lieu of or in addition to the energy storage circuitry 24, such planes might extend between the terminals of such circuitry and those of the switching devices. It should be noted that, while a series of exemplary embodiments are described below, more generally, the particular configuration, arrangement, dimensions, and spacing of the bus elements may be varied or specified depending upon specific operating frequencies, voltage and current levels, properties of the materials comprising the bus elements, and properties of materials separating the bus elements from one another and from neighboring components. Thus, the bus system 10 can be tuned or engineered to optimally adjust for transmission impedance, reducing the total loop inductance in a variety of circuit configurations.

FIG. 2 illustrates a portion of an exemplary configuration of the bus system 10 in diagrammatical form. In the illustration of FIG. 2, a support 38 for circuit components serves as a base for packaged switching circuitry 40. The bus elements 14 and 16 essentially wrap around at least a portion of the support 38 and are electrically coupled to the switching circuitry 40, such as by single or multiple wire bonds, jumper cables, direct bonds and solder, or any other suitable termination technique, as illustrated generally by reference numeral 42 in FIG. 2. The bus elements extend to, and may include terminations for the additional circuitry in the assembly, particularly capacitors 44 which may form part of energy storage circuitry of the type illustrated at reference numeral 24 in FIG. 1. The embodiment of FIG. 2 allows for pre-forming of the bus structure with terminations made to the parallel bus elements upon installation.

As a variant or alternative to the structure of FIG. 2, FIG. 3 illustrates a support 38 to which a similar switching circuitry package 40 is mounted. Bus elements 14 and 16 again parallel to one another, are again electrically coupled to the switching circuitry package. In the embodiment of FIG. 3, however, the bus extends in such a manner as to dispose the capacitors 44 therebetween. As will be appreciated by those skilled in the art, various mechanical and electrical interconnection arrangements may thus be envisaged.

It should be noted that in certain physical and electrical designs, the bus system may serve further circuitry. For example, multiple converter circuits may be supported on different supports that share a common bus system. Diagrammatically, referring again to FIGS. 2 and 3, an additional support, similar to support 38, may be provided on a side of circuitry 24 opposite to the support 38 illustrated. The bus system then may extend to terminal locations for switching devices of the additional converter circuits.

FIGS. 4-10 illustrate aspects of a specific implementation of the inventive bus system. While the implementation is provided here for highlighting particular potential features of the system, it should be borne in mind that the present system is not limited to this or any specific implementation. Indeed, many different circuits and physical configurations may benefit from the present technique.

In the implementation of FIG. 4, a support 38 defines an electrical reference plane and supports a number of different circuit components interconnected to form a modular power converter. A driver circuit board 46 serves to receive control signals and applies drive signals to a series of switching circuit assemblies 48. As noted above, the switching circuit assemblies 48 may output any desired waveforms, based upon the signals received from control circuitry and from the driver circuit board. The support 38 further supports a package energy storage or filtering circuit 50 on a side opposite the drive circuit board 46 and switching circuit assemblies 48. In the illustrated embodiment, the device is liquid-cooled, with a coolant inlet 52 being provided along a side of the support 38, and a coolant outlet 54 being provided beside the inlet for conducting a stream of coolant to and from the support, thereby cooling the circuitry during operation.

The bus system 10, in the implementation of FIG. 4, is provided adjacent an edge of the support 38 for receiving input power and for transmitting output power from the device during operation. In particular, as will be appreciated by those skilled in the art, in the implementation illustrated in FIG. 4, a power converter of the type diagrammatically illustrated in FIG. 1 may be defined in which terminals linked to the switching circuit assemblies 48 are electrically connected, as described more fully below, to terminals for the package energy storage circuitry 50. The bus system 10, then, provides for significantly reducing parasitic inductance between these circuit components during operation as described more fully below.

As noted above, the present technique facilitates placement of connection areas or pads integral with the bus elements in close proximity to the points where connections are made from the power electronic switches, as within assemblies 48 of FIG. 4. As will be appreciated by those skilled in the art, in prior arrangements, where packaged power electronic switching devices were employed, bus elements were connected to an intermediate interconnect element, and therethrough to the switching devices, thereby introducing the potential for parasitic inductance. In the present technique, however, the connection areas or pads may be "directly" coupled to the switching devices via single conductive link without the intermediary of an interconnect. Similarly, where the bus system of the present technique is used in conjunction with packaged power electronic devices, the bus elements may be designed to extend into the package, so as to avoid the use of interconnects or similar intermediate structures that could introduce parasitic inductance.

In the implementation of FIG. 4, the bus system 10 is coupled to a terminal assembly 56 which serves to lead power to and from the device. In this embodiment, the terminal assembly 56, which is separable from the bus system 10, provides for electrical connection to the bus system, and to external circuitry via terminal conductors 58. Alternative terminal structures may, of course, be envisaged, and the terminal structures may be at least partially incorporated into the bus system as described in the illustrated implementation below. Also, as noted above, an additional support 38 may be provided on a side of packaged energy storage circuitry 50, with the bus system being extended to terminal locations for the switching devices of additional converter circuitry.

Figure 5:
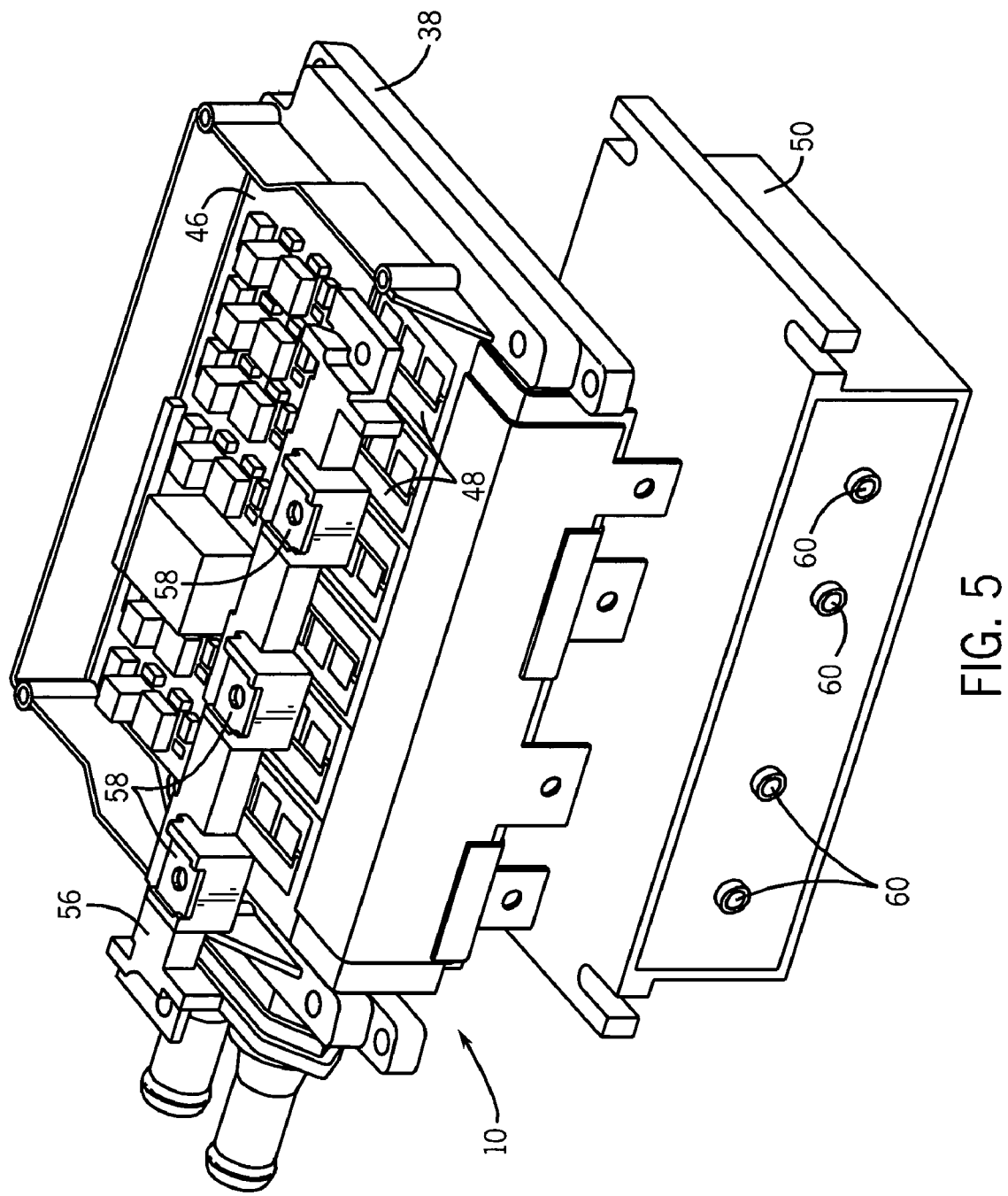
FIG. 5 is an exploded perspective view of the arrangement of FIG. 4, wherein an energy storage assembly and a terminal strip have been removed to better show the exemplary bus structure.

FIG. 5 illustrates an exploded perspective view of the implementation of FIG. 4. In particular, the packaged energy storage circuitry 50 has been removed from the support 38 to better illustrate how the exemplary bus system 10 is interconnected between this packaged circuitry and other circuit components. Moreover, in the illustration of FIG. 5, the terminal assembly 56 has been removed to show the exemplary configuration of the bus system which is contoured to adapt to the edge of the support 38 and to extend between the packaged energy storage circuitry 50 and a location immediately adjacent to the switching circuit assemblies 48. The terminals for the energy storage circuitry are indicated in FIG. 5 by reference numeral 60. As can be seen, the bus system accommodates directly linking these terminals to the bus system, and particularly to individual bus elements of the system as better illustrated in the subsequent figures.

Figure 6:
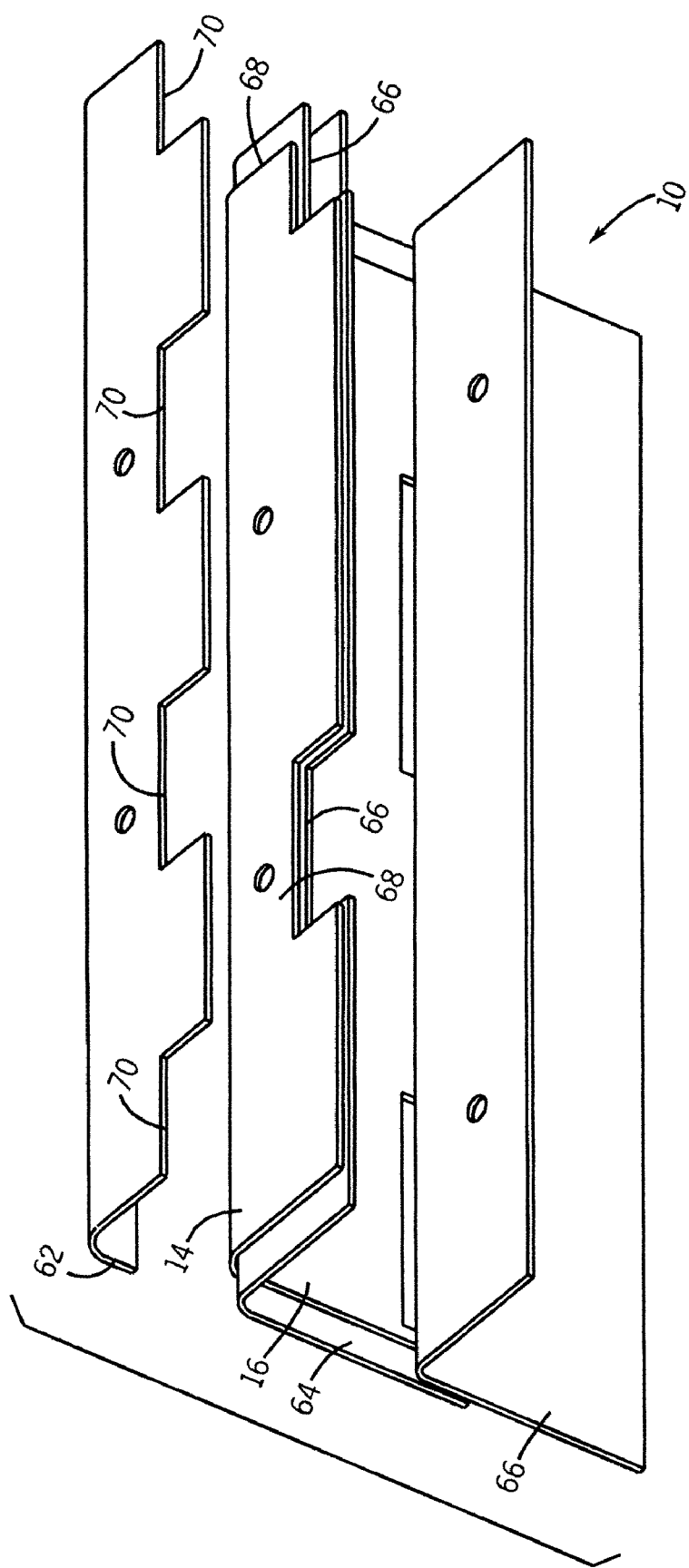
FIG. 6 is an exploded perspective view of the bus structure shown in FIG. 5, including conductive and insulative elements prior to assembly.

FIG. 6 illustrates a perspective view of the exemplary bus system 10 as applied in the implementation of FIGS. 3 and 4, in an exploded depiction. The exemplary system 10 includes flat bus elements 14 and 16 configured conformingly with the application, separated from one another and from neighboring circuit components by insulative layers 62, 64 and 66. As can be seen in FIG. 6, the bus elements 14 and 16 are generally co-extensive with one another so as to aid in cancellation of parasitic conductance. The bus elements and insulative layers may be made of any suitable material, with presently contemplated material for the bus elements including aluminum or copper, and materials for the insulative layers including sheet materials, such as a spun fiber material commercially available from E.I. du Pont de Nemours and Company under the registered trademark Nomex. It has also been found that, where copper is used for the bus elements, bonding to conductors from the power switching devices can be improved by providing aluminum pads in the copper elements, such as areas of aluminum that are rolled, pressed, or otherwise disposed in recesses in the copper elements. Where copper conductors are bonded to the elements, copper could, of course, be used for the pads. Moreover, outer layers 62 and 66 may be eliminated from the structure, such as where no isolation is necessary.

As noted above, the various components of the bus system illustrated in FIG. 6 are preferably somewhat flexible, permitting them to be conformingly bent or pre-formed to follow desired contours. Also, the components may be configured to present features which aide in isolating the bus elements from one another and from other components, and for connecting the bus elements to circuitry. In the implementation illustrated in FIG. 6, for example, the insulative layers 62, 64 and 66 are configured to extend beyond the extremities of bus elements 14 and 16 slightly to provide edge isolation. Additional materials may be provided in such areas, such as to further insolate the bus elements from short circuits or other contact. Conversely, recesses are formed in the insulative layers and in the bus elements themselves to allow for contacts to circuitry. In the implementation illustrated in FIG. 6, for example, recesses 66 are formed in insulative layer 64 to permit partial exposure of bus element 16 at locations where connections will be made to circuitry. At similar locations, recesses 68 are formed in bus element 14 to expose bus element 16. Further recesses 70 are formed in insulative layer 62 to expose both bus element 14 and bus element 16 in the final stacked structure.

Figure 7:
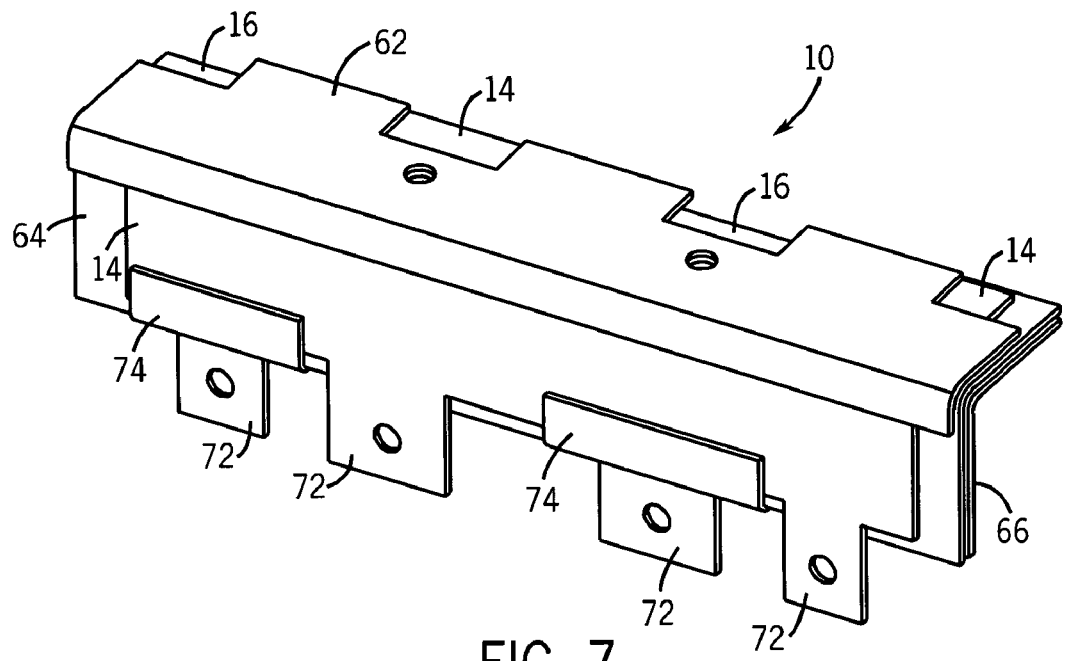
FIG. 7 is a front assembled view of the components of FIG. 6.

As noted above, the bus system may be pre-formed as a laminated structure, where desired. The final assembled system will permit connections where desired, and may be configured in various pre-formed geometries. FIG. 7 represents a finished geometry for the exemplary implementation shown in FIG. 6. In the view of FIG. 7, the bus elements 14 and 16 have been assembled with insulative layers 62, 64 and 66. It should be noted that at alternate locations, owing to the positions of the recesses discussed above with reference to FIG. 6, both bus element 14 and bus element 16 are accessible through the stacked layers. Similarly, termination tabs 72 are provided extending from both bus elements to permit further attachment, in this implementation to the terminals 60 of the packaged energy storage circuitry (see FIG. 5). Finally, additional insulative material, which may be an extension of one or more insulative layers may be wrapped around one or more of the bus elements as indicated at reference numeral 74 in FIG. 7 to provide additional isolation, where desired.

The laminated structure may be formed by adding a suitable adhesive layer between the bus elements and the insulative layers, as well as along any edges where the insulative layers meet and may be joined. The assembled elements and layers may then be pressed and heated, depending upon the requirements of the adhesive layers, to form a tightly laminated structure. While the laminated structure may be bent, formed or otherwise contoured so some extent, such contouring may be facilitated if performed prior to the lamination of the elements and layers.

Figure 9:
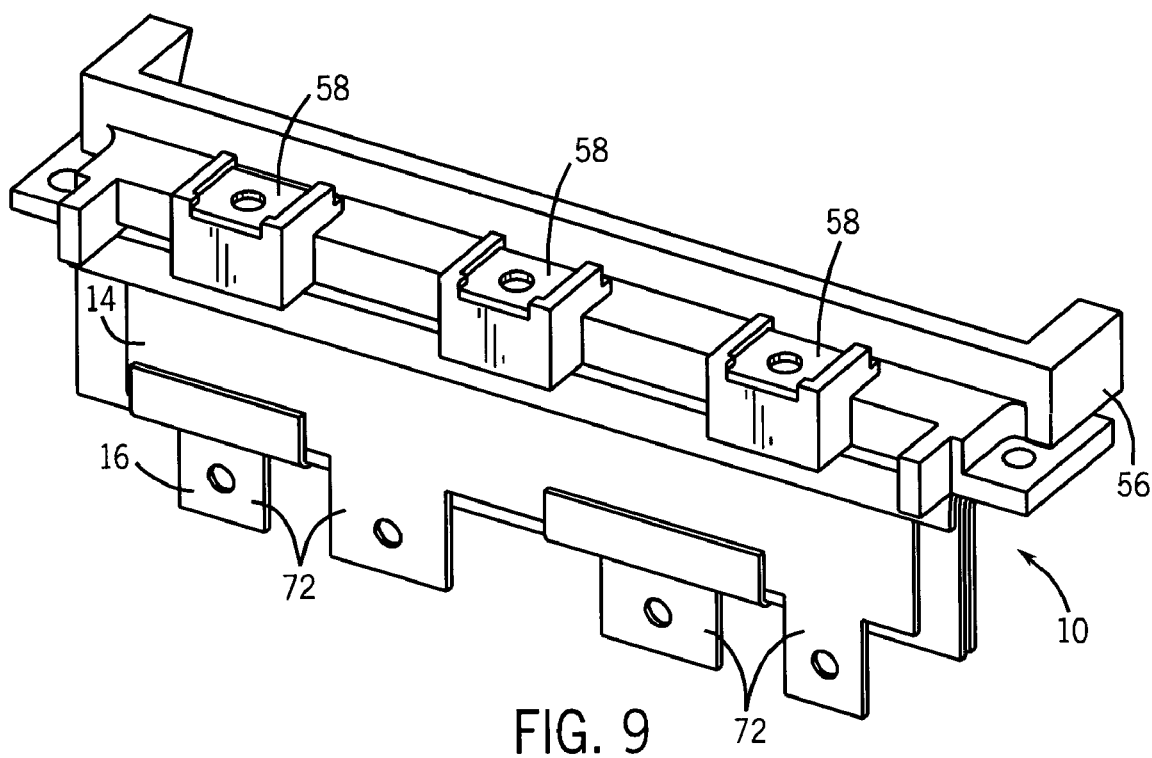
FIG. 9 is top perspective view of the front of the bus structure and terminal assembly of FIG. 8 following assembly.
Figure 8:
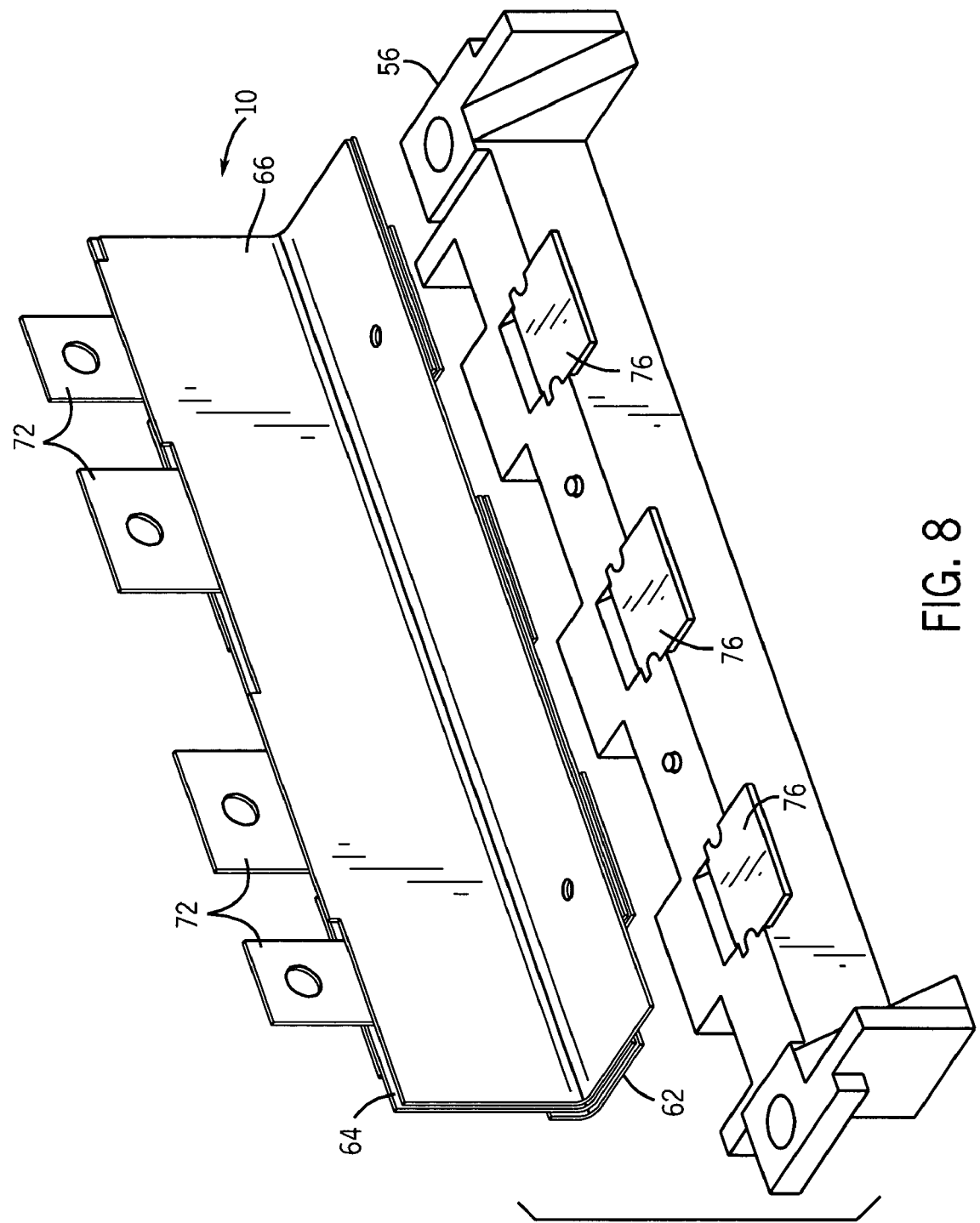
FIG. 8 is a bottom rear perspective view of the assembled component of FIG. 7 and an exemplary terminal assembly to which the bus structure may be joined.
Figure 10:
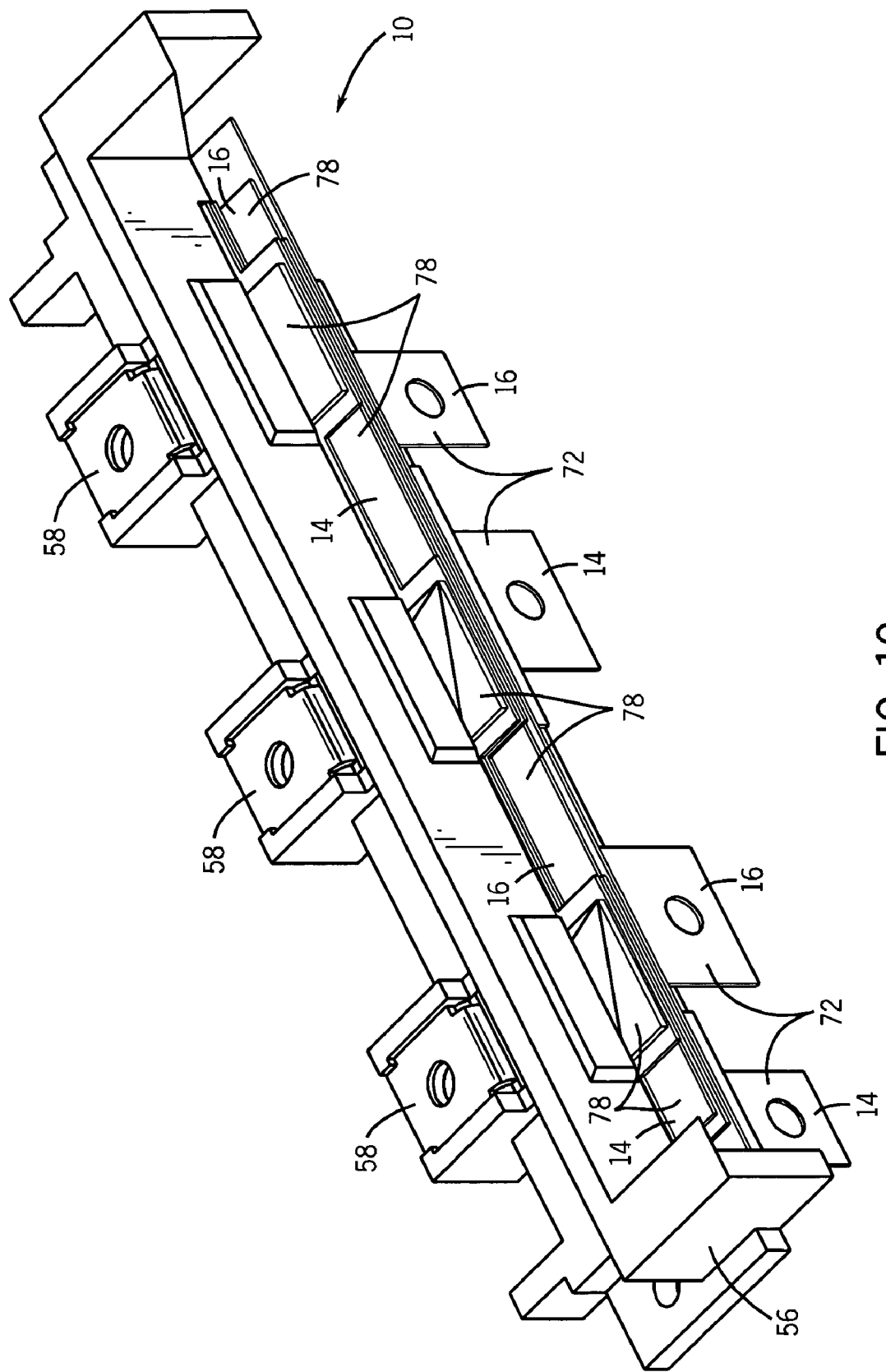
FIG. 10 is a top perspective view of the rear of the assembly of FIG. 9 illustrating pads to which switching components may be electrically coupled for operation.

The bus structure may then be assembled with other circuit components, as illustrated in FIG. 8. In the implementation of FIG. 8, the bus system 10 is assembled with the terminal assembly 56 described above. In particular, in this implementation the bus system 10 is stacked with the pre-assembled terminal assembly 56 such that bottom surfaces 76 of the terminal conductors are positioned adjacent to portions of insulative layer 62 between which the exposed bus element portions are provided (see FIG. 7). Following such assembly, as illustrated in FIG. 9, the bus system and terminal assembly exposes termination tabs 72 of the bus system, as well as terminal conductors 58 of the terminal assembly for a connection to the packaged energy storage circuitry and to external circuitry, respectively. Furthermore, as shown in FIG. 10, along a rear side of the bus system 10 and terminal assembly 56, a series of connection pads 78 are exposed corresponding to locations of both the bus element 14 and bus element 16, and to portions of the terminal conductors 58. Thus, direct connection, such as via wire boning, can be made to the other circuit elements, including to the switching circuit assemblies 48 illustrated in FIG. 4 and discussed in detail above.

As will be appreciated by those skilled in the art, then, the unique bus system of the present technique allows for contiguous generally parallel bus elements which can extend completely between terminal locations for switching devices and terminal locations for other circuitry, such as filtering circuitry, energy storage circuitry, and the like. Where desired, certain elements of the system may extend into and through certain of these circuit assemblies, particularly through the filtering and energy storage circuitry in a manner discussed above generally with reference to FIGS. 2 and 3. Also, as noted above, the bus elements may be designed to extend into packaged switching devices to avoid the need for interconnects.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An electrical bus system comprising:
a first conductive bus element defining a first electrical reference plane extending substantially contiguously between a terminal for a first conductor coupled directly to power electronic switching circuitry on a first side of a support and terminals for an energy storage or filtering circuit on a second side of the support;
a second conductive bus element defining a second electrical reference plane extending substantially contiguously between the terminals for a second conductor coupled directly to the power electronic switching circuitry and the terminals for the energy storage or filtering circuit; and
at least one insulative layer disposed intermediate the first and second bus elements to electrically isolate the elements from one another;
wherein the first and second conductive bus elements extend generally in parallel between the respective terminals to reduce parasitic inductance during operation; and
wherein the bus system is disposed along an edge of the support between the first and second sides.

2. The bus system of claim 1, wherein the bus elements and the insulative layer form a laminate structure.

3. The bus system of claim 1, further comprising at least one additional insulative layer disposed adjacent to the first or the second bus element for electrically isolating the bus element from adjacent components.

4. The bus system of claim 1, wherein the first bus element and the insulative layer include recesses for accessing connection areas of the second bus element.

5. The bus system of claim 1, wherein the first and second bus elements include integral connection areas for electrically coupling the bus system to power electronic switching circuitry for three phases of ac power.

6. An electrical bus system comprising:
a first conductive bus element defining a first electrical reference plane extending substantially contiguously between a terminal for a first conductor coupled directly to power electronic switching circuitry on a first side of a support and terminals for an energy storage or filtering circuit on a second side of the support;
a second conductive bus element defining a second electrical reference plane extending substantially contiguously between a terminal for a second conductor coupled directly to the power electronic switching circuitry and the terminals for the energy storage or filtering circuit;
an inner insulative layer disposed intermediate the first and second bus elements to electrically isolate the elements from one another; and
first and second outer insulative layers disposed adjacent to the first and second bus elements, respectively, opposite the inner insulative layer, to electrically isolate the elements from other components;

wherein the first and second conductive bus elements extend generally in parallel between the respective terminals to reduce parasitic inductance during operation; and wherein the bus system is disposed along an edge of the support between the first and second sides.

7. The bus system of claim 6, wherein the bus elements and the insulative layers are contoured to conform to at least one support on which the power electronic switching circuitry and energy storage or filtering circuit are mounted.

8. The bus system of claim 6, wherein the bus elements and the insulative layers form a laminate structure.

9. The bus system of claim 6, wherein the first bus element and the insulative layers include recesses for accessing connection areas of the second bus element.

10. The bus system of claim 6, wherein the first and second bus elements include integral connection areas for electrically coupling the bus system to power electronic switching circuitry for three phases of ac power.

11. An electrical bus system comprising:
a first conductive bus element defining a first electrical reference plane extending substantially contiguously between a terminal for a first conductor coupled directly to power electronic switching circuitry on a first side of a support and terminals for an energy storage or filtering circuit on a second side of the support;
a second conductive bus element defining a second electrical reference plane extending substantially contiguously between a terminal for a second conductor coupled directly to the power electronic switching circuitry and the terminals for the energy storage or filtering circuit;
an inner insulative layer disposed intermediate the first and second bus elements to electrically isolate the elements from one another; and
first and second outer insulative layers disposed adjacent to the first and second bus elements, respectively, opposite the inner insulative layer, to electrically isolate the elements from other components;
wherein the first and second conductive bus elements extend generally in parallel between the respective terminals to reduce parasitic inductance during operation, and wherein the bus elements and the insulative layers form a laminate structure and are contoured to conform along an edge of the support between the first and second sides.

12. The bus system of claim 11, wherein the first bus element and the insulative layers include recesses for accessing connection areas of the second bus element.

13. The bus system of claim 11, wherein the first and second bus elements include integral connection areas for electrically coupling the bus system to power electronic switching circuitry for three phases of ac power.

* * * * *